United States Patent [19]
Rudder et al.

[11] Patent Number: 5,418,018
[45] Date of Patent: May 23, 1995

[54] CHEMICAL VAPOR DEPOSITION OF DIAMOND FILMS USING WATER-BASED PLASMA DISCHARGES

[75] Inventors: Ronald A. Rudder, Wake Forrest; George C. Hudson, Goldsboro; Robert C. Hendry, Hillsbourough; Robert J. Markunas, Chapel Hill, all of N.C.

[73] Assignee: Research Triangle Institute, Research Triangle Park, N.C.

[21] Appl. No.: 61,291

[22] Filed: May 14, 1993

Related U.S. Application Data

[63] Continuation of Ser. No. 787,891, Nov. 5, 1991, abandoned.

[51] Int. Cl.[6] .............................. B05D 3/06; B01J 3/06
[52] U.S. Cl. ................................... 427/577; 427/249; 427/562; 427/450; 423/446
[58] Field of Search ............... 427/571, 577, 249, 562, 427/575, 590, 450, 122; 423/446

[56] References Cited

U.S. PATENT DOCUMENTS

| | | | |
|---|---|---|---|
| 4,871,581 | 10/1989 | Yamazaki | 427/571 |
| 5,023,109 | 6/1991 | Chin et al. | 427/577 |
| 5,106,452 | 4/1992 | Kadono et al. | 427/571 |
| 5,110,405 | 5/1992 | Sawabe et al. | 427/577 |
| 5,110,577 | 5/1992 | Tamor et al. | 427/249 |
| 5,117,299 | 5/1992 | Kondo et al. | 423/446 |
| 5,124,179 | 6/1992 | Garg et al. | 427/587 |
| 5,142,390 | 8/1992 | Ohta et al. | 423/446 |
| 5,145,711 | 9/1992 | Yamazaki et al. | 427/249 |
| 5,268,201 | 12/1993 | Komaki et al. | 427/590 |
| 5,275,798 | 1/1994 | Aida | 427/577 |

FOREIGN PATENT DOCUMENTS 1-24093  1/1989  Japan.
1197391  8/1989  Japan.

OTHER PUBLICATIONS

Rudder et al "Chem. Vap. Dep. of Diamond Films from Water Vapor rf-Plasma Discharges", *Appl. Phys. Lett.*, 60 (30), 20 Jan. 1992.

*Primary Examiner*—Marianne Padgett
*Attorney, Agent, or Firm*—Oblon, Spivak, McClelland, Maier & Neustadt

[57] ABSTRACT

A chemical vapor deposition (CVD) technique (process and apparatus) for the growth of diamond films using vapor mixtures of selected compounds having desired moieties, specifically precursors that provide carbon and etchant species that remove graphite disclosed. The selected compounds are reacted in a plasma created by a confined rf discharge to produce diamond films on a diamond or a non-diamond substrate. In a preferred embodiment a gas phase mixture including at least 20% water which provides the etchant species is reacted with an alcohol which provides the requisite carbon precursor at low temperature (300°–650° C.) and low pressure (0.1 to 10 Torr), preferably in the presence of an organic acid (acetic acid) which contributes etchant species reactant. In the preferred embodiment the volumetric mixtures have typically been 40–80% water and 60–20% alcohol. The gaseous mixture of $H_2O$ and alcohol is dissociated to produce H, OH, and carbon radicals. Both OH and atomic H are capable of etching graphite from the depositing carbon layer. The selected compounds are reacted in a CVD apparatus in which a confined rf discharge is used to create an electric discharge or plasma. The plasma is confined between an inductive rf coil via transformer isolation from the chamber ground.

12 Claims, 11 Drawing Sheets

METHANOL IN WATER  |—————| 5 μm

ETHANOL IN WATER  |—————| 5 μm

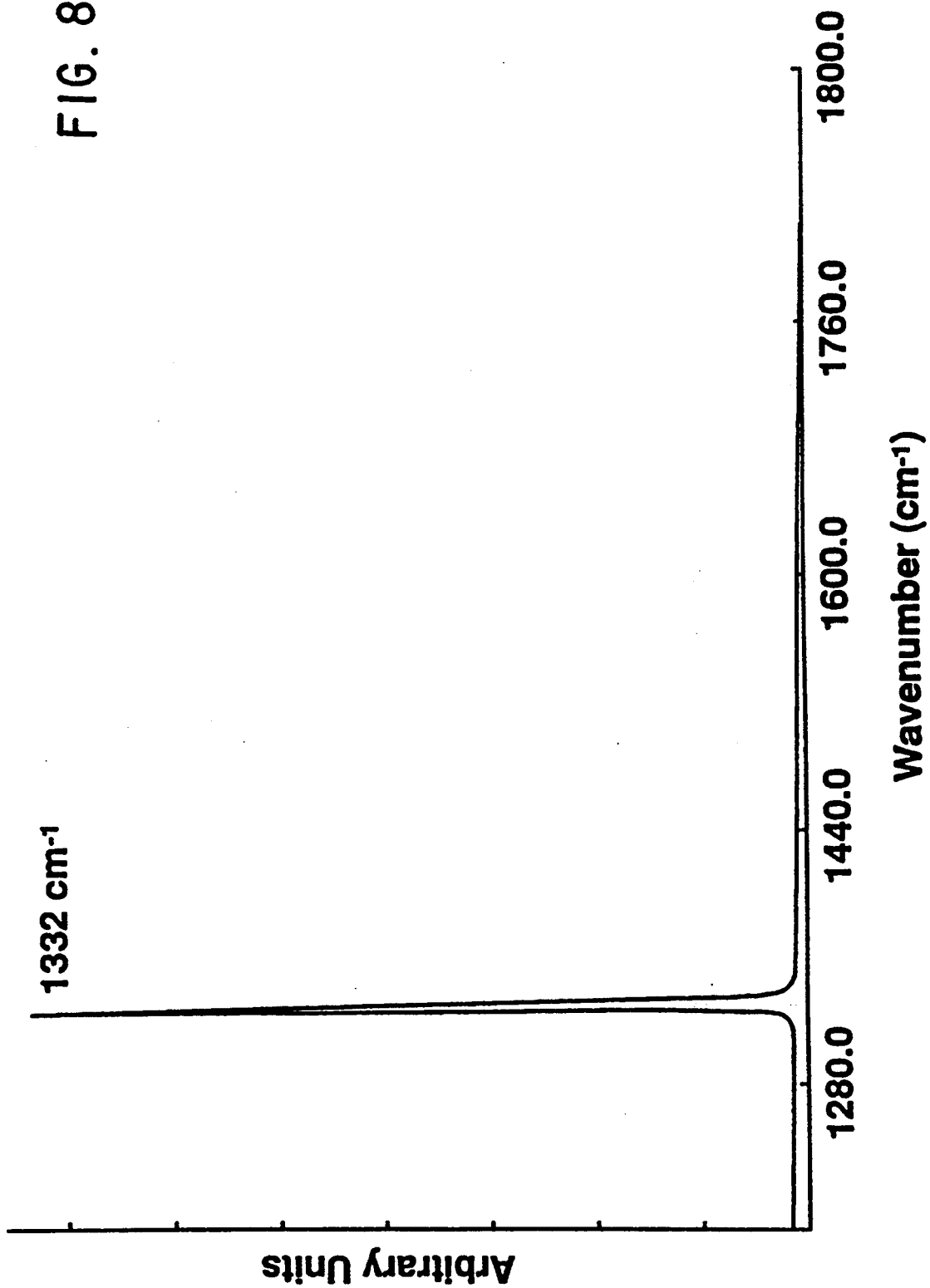

FWHM ~ 2.6 cm⁻¹

Before Growth     15 μm

After Growth     15 μm

15 μm

5 μm

3 μm 1.5 μm

CHEMICAL VAPOR DEPOSITION OF DIAMOND FILMS USING WATER-BASED PLASMA DISCHARGES

The U.S. Government has a paid-up license in this invention and the right to limited circumstances to require the patent owner to license others on reasonable terms as provided for by the terms of contract #N00014-86-C-0460 awarded by the Office of Naval Research.

This is a continuation of application Ser. No. 07/787,891, filed on Nov. 5, 1991, now abandoned.

BACKGROUND OF THE INVENTION

1. Field of the Invention

This invention relates to a process for chemical vapor deposition of diamond films.

2. Discussion of the Background

Deposition of diamond films using CVD techniques has been well established. Numerous workers have used a plethora of techniques and source gases for diamond growth [see T. R. Anthony in Mat. Res. Soc. Symp. Proc. 162, 61 (1990) or see also P. K. Bachmann et al. in Diamond and Related Materials 1, 1 (1991)]. The techniques have included microwave-plasma assisted, hot filament assisted, dc plasma assisted, arc-jet discharges, rf plasma assisted, and oxy-acetylene-torch CVD techniques. The vast majority of the work depends on molecular hydrogen dissociation/activation in high-temperature plasma regions or in equivalent high temperature regions such as a hot filament or an oxy-acetylene torch. As a consequence of the sample temperature being much lower than the source temperature, there exists a superequilibrium of atomic hydrogen at the diamond growth surface. Thus, diamond growth proceeds once a sufficient amount of atomic hydrogen is produced. One role of the atomic hydrogen is to dissolve any graphite from the depositing diamond layer. Some of the earliest and simplest theories of diamond growth hypothesized that diamond CVD growth was a codeposition process involving the deposition of both graphite and diamond but in which the graphite was dissolved preferentially, resulting in stabilization of the diamond phase. Thus, providing an effective graphite etchant to dissolve graphite from a depositing diamond layer is critical in any diamond CVD process. Another role of the atomic hydrogen is to promote diamond formation through stabilization of the surface of diamond. Additional insight into the thermodynamics of diamond deposition has been provided by W. A. Yarbrough whose quasiequilibrium calculations have shown that, at high fractions of atomic hydrogen (greater than 0.1%), diamond condensation is preferred over graphite [see W. A. Yarbrough in Mat. Res. Soc. Symp. Proc. 192, 75 (1990)]. Hence, diamond deposition techniques need to generate a high fraction of atomic hydrogen to insure diamond promotion over graphite. In addition, with the deposition process involving carbon atom addition per unit time, the deposition process must also provide a critical absolute atomic hydrogen flux per unit time in order to stabilize the instantaneous growth surface. It is clear that, in practice, the high-temperature extremes of these physical and chemical sources are necessary in order to produce the atomic hydrogen concentrations necessary for diamond growth. Indeed, those sources which are the hottest (dc arc plasmas and oxy-acetylene torches) produce diamond at the fastest rates. This is a consequence of those sources having both high fractions of atomic hydrogen and high absolute concentrations.

Using heavy molecular hydrogen dilutions, a great many hydrocarbon, halocarbon, fluorocarbon, and organic sources have been used to produce diamond films. Typically, the promotion of diamond bonding over graphitic bonding is only accomplished when the percentage of hydrocarbon in the gas phase is small, insuring that the percentage of graphite deposited by the particular technique can be dissolved before graphitic phases can be incorporated into the carbon layers. Correspondingly, the best films are deposited with hydrocarbon percentages between 0.5-2.0%. Films deposited at higher concentrations show little if any evidence of diamond bonding from Raman analysis [see C. Hata and Y. Sato in New Diamond, 32-34 (1990)].

Atomic F, atomic O, molecular $F_2$, and OH are also efficient in dissolving graphite. Indeed, variations from the traditional 95-99% $H_2$ with 1-5% $CH_4$ feed gasses with F, Cl, O, and OH additives have been accomplished. In addition, growth of diamond from oxy-acetylene flames has been accomplished using a 1:1.05 mix of $O_2$ to $C_2H_2$ as the premix entering the combustion flame [see L. M. Hansen et al. in Mater. Letters 7, 289 (1988)].

Recent published work by the assignee of the present invention has demonstrated that thermally-activated fluorine based processes have deposited diamond films [see R. A. Rudder, J. B. Posthill, and R. J. Markunas in Electronics Letters 25, 1220 (1989)]. This work (based on atomic fluorine in the process) dissolves graphite in an analogous manner to the atomic hydrogen in the conventional processes described above. Other workers at Rice University have used mixed hydrogen-halogen chemistries activated in a hot monel tube to deposit diamond particles on substrates removed from the hot zone [see D. E. Patterson et al. in Applications of Diamond Films and Related Materials, Elsevier Science Publications, 564-576, (1991)]. Those workers have used $F_2/CH_4$ and $H_2/CF_4$ gasses thermally activated in the hot zone to deposit diamond in cooler regions of the furnace. The activation results in highly exothermic reactions via the formation of HF. The chemical conversion at atmospheric pressure produces a hot chemical flame source wherein active fluorine and hydrogen can participate in diamond growth.

In related published work by the present assignee, it has been shown that halogens (for example $CF_4$) can be added to a hydrogen-based plasma process to enhance diamond nucleation. This process deposits diamond films at much higher concentrations of $CF_4$ than could be used if $CH_4$ were used instead of $CF_4$. Hence, fluorine liberated by the plasma plays a key role in promoting diamond growth.

O and OH chemistries have been exploited in plasma-assisted techniques. Small quantities of oxygen and water vapor have been added to microwave plasma reactors. It has been found that the small percentages (0.5-2%) of oxygen and the small percentage of water vapor (0-6%) improve the Raman spectra and decrease the temperature at which diamond can deposit [see Y. Saito et al. in J. Mat. Sci. 23, 842 (1988) or Y. Saito in J. Mat. Sci. 25, 1246 (1990)]. Higher percentages have been observed to degrade the diamond quality. Thus, microwave CVD reactor work has discouraged many researchers from pursuing discharges richer in oxygen or discharges containing high concentrations of OH.

In contrast to this work, Buck et al. have used pure methanol or Ar/methanol microwave discharges to deposit diamond at a pressure of 23 Torr [see M. Buck et al. in Mat. Res. Soc. Symp. Proc. 162, 97 (1990)]. This work demonstrates that diamond growth from microwave discharges is possible at higher O/C and O/H ratios of feed gas material. The addition of an inert gas to the microwave acts as a diluent and provides no means to chemically alter the O/C/H ratio, and hence this process provides no means to adjust the growth chemistry.

Yet another way to deposit diamond utilizing high O/C ratios is an oxy-acetylene flame. In an oxy-acetylene flame, oxygen ($O_2$) and acetylene ($C_2H_2$) are spontaneously reacted in a chemical flame. Similar to the microwave plasma diamond growth, the chemical flame is at an extremely high temperature 3000° C. At those temperatures, the reactants ($O_2$ and $C_2H_2$) and the burn products (CO, $CO_2$, $H_2O$) are in a partially dissociated state such that atomic H is readily available to the diamond growth surface.

The production of atomic hydrogen from the various plasma and chemical techniques involving highly energetic physical sources (dc plasmas, arc-discharges, microwave plasma, rf-plasmas, hot-filaments) and involving hot chemical sources (oxy-acetylene torches, atmospheric $F_2/CH_2$ or $H_2/CF_4$ reactors) has been necessary to maintain a critical atomic hydrogen concentration sufficient to produce diamond growth. Insufficient supply of atomic hydrogen to the diamond growth surface results in poor diamond growth or no diamond growth. Certainly, the theoretical work of W. A. Yarbrough adds some insight into the nature of the diamond deposition process. A critical fraction of atomic hydrogen is necessary in the gas phase in order for diamond to precipitate rather than graphite. Unfortunately, the field of diamond CVD is not advanced enough to quantitatively define the absolute concentration necessary for every growth pressure and temperature.

The necessity for these high-temperature physical and chemical sources is required to maintain a high, steady-state atomic hydrogen population which is in turn related to the lifetime of the atomic hydrogen species. Atomic hydrogen is extremely reactive and possesses the highest thermal velocity of any element. Once created, atomic hydrogen rapidly diffuses from the point of creation and reacts frequently to either recombine with itself through 3-body interactions or to form a hydride compound with another element. Examples of such losses are H—H recombination on CVD reactor walls and H—graphite interactions to form $CH_4$. Both loss mechanisms (recombination and hydride formation) deplete the gas phase of atomic hydrogen. Because loss rates are high with the traditional molecular $H_2$-based process, the generation rate must compensate the loss in order to maintain a sufficient concentration of atomic hydrogen. This requirement for a high generation rate to offset the loss rate imposes the necessity for high-temperature physical or chemical sources in traditional diamond CVD. If the loss rate could be reduced, then low-temperature physical and chemical sources could be used. Alternatively, if the loss rate could be reduced, then the traditional high-temperature sources would generate even higher fluxes of atomic H, and consequently higher diamond deposition rates would be achieved.

The physical chemistry of diamond synthesis has focused on reactions carried out under these high-temperature, extremely energetic conditions. This is true for equilibrium approaches such as high pressure, high temperature synthesis from metal melts, and is also true for kinetic approaches in which kinetic constraints are used to select a product state (diamond) other than the equilibrium form (graphite). In short, many techniques each supported by different sorts of facilities have been developed to implement molecular hydrogen-based process chemistries based on the production of atomic hydrogen from highly energetic sources.

SUMMARY OF THE INVENTION

Accordingly, one object of this invention is to provide a new and improved process for producing single-crystal and polycrystalline diamond films using CVD techniques which does not rely on molecular hydrogen-based processes.

Another object of this invention is to produce diamond films with CVD techniques which do not necessarily require either high-temperature physical or high-temperature chemical sources.

One object of this invention is to provide graphite etchant species (H and OH) through said compounds of water and water-based solutions containing organic acids, inorganic acids, hydronium ions, hydrazine, and hydrogen peroxides.

One object of this invention is to reduce loss mechanisms for atomic H and OH in diamond growth through introduction of substantial water vapor $>20\%$, preferably 40–80% to the gas phase.

Another object of this invention is to supply the carbon source for diamond growth in a water-based process from simple alcohols and hydrocarbons: the alcohols providing the distinct advantage of being miscible in water.

Yet a further object of this invention is to produce diamond films using inexpensive, environmentally benign materials.

Still a further object of this invention is to provide a simple, industrially safe process and apparatus for producing diamond films, whereby the number of feasible commercial applications for the present technology is increased.

These and other objects are achieved by providing a new and improved process in which water-based processes provide selected compounds having desired moieties, specifically precursors that provide carbon source materials for diamond growth and etchant species for the removal of graphitic material. The selected compounds are reacted to produce diamond films on diamond or on non-diamond substrates. The reaction process for the production of selected compounds with such moieties occurs in a gaseous environment which efficiently generates the etchant species (H and OH) by providing molecules such as water, organic acid, inorganic acids, hydronium ions, hydrazines, or peroxide molecules which have larger cross-sections for electron impact and which have either comparable bond strengths or considerably lower bond strengths for H dissociation. Furthermore, the reaction process for the production of selected compounds with such moieties occurs in an environment which inhibits the loss rate of etchant species, thereby increasing the absolute concentration of etchant species for a given generation rate (power level).

This accomplishment has been demonstrated in a rf plasma discharge system wherein the water-based plasma processes which are disclosed here can be compared to H₂-based discharges for the growth of diamond. While we can not provide numbers for the absolute atomic hydrogen fluxes for the water verses the H₂ based processes, we can compare the power levels and pressures necessary for diamond growth in this rf plasma discharge system between both processes and derive the efficacy of each process for diamond growth. It has been observed that the generation of atomic H and OH radicals in the water-based processes sufficient to deposit high quality diamond is accomplished at lower input powers and lower pressures than what is possible in the H₂-based process. The loss of atomic H from the gas phase in the water-based process is inhibited by water passivation of reactor walls, lower diffusion coefficients of atomic H in $H_2O$ than atomic H in $H_2$, and atomic hydrogen complexing with water molecules in the gaseous discharge.

It is instructive to consider atomic hydrogen dissociated in a water-based plasma process to be analogous to H-atom dissociation in liquid acid-water solutions. In common acid-water solutions, the ph of the solution is the negative common logarithm of the dissociation. An acid of ph 5 has one molecule in $10^5$ dissociated. The "dissociated" hydrogen population (existing as an ion) is one in $10^5$. The dissociated hydrogen ion does not escape the water solution rather it complexes with a water molecule to form a stable hydronium $H_3O^+$ ion in solution. It should be realized that the stability of the hydronium ions in solution is related to the dielectric screening of the water molecules and thus to the density of the water. At low pressures, the effective screening is reduced. Consequently, the lifetimes of the hydronium ions in low pressure diamond CVD will not be as long the lifetime of hydronium ions in liquid solution.

In the present invention, H atoms liberated for example in a rf plasma will have to diffuse in a water ambient rather than a molecular hydrogen ambient. To illustrate the diffusion coefficient change, note that the diffusion coefficient, D, is proportional to the $$\sqrt{\frac{1}{m^1} + \frac{1}{m^2}}$$

where "m¹" and "m²" are the respective masses. The difference between H in $H_2O$ compared to H in $H_2$ will be 83% as fast. As a consequence, the diffusion of H atoms from the generation region will be slower in the water ambient, increasing the steady-state population of H atoms. In the present invention, H atoms liberated for example in a rf plasma discharge may also become ionized and complex with $H_2O$ molecules in the plasma gas to form $H_3O^+$. These complexed molecules (as they do in the acid solutions) will be chemically very reactive. Once complexing with the water molecule, the molecular weight of the complex is 19 times greater than the hydrogen atom and correspondingly would travel with a thermal velocity ~4 times slower. Hence, the hydronium complex would not diffuse as rapidly from the point of creation as the hydrogen atom. The generation rate will not need to be as high as the generation rate in a molecular $H_2$-based process to maintain a sufficient atomic hydrogen concentration. Upon collision of the hydronium ion with a $H_2O$ molecule in the gas-phase or on the walls of the reactor, the H-atom is not loss to recombination. It may be transferred to the adjacent water molecule resulting in no loss of reactant species. The dipole interactions responsible for the complexing of the H-ion to the water molecule are such that the approach of two hydronium ions will likely experience electrostatic repulsion before the ions could close enough to permit H—H atom recombination from 2 hydronium ions. Thus, the loss of reactive atomic hydrogen in a water-based plasma-process will be suppressed. Hence, for a given power level the water-based process will maintain a much higher steady-state population of atomic hydrogen.

In addition, the water vapor discharges also produce OH groups though plasma dissociation of the $H_2O$ molecules. Both H and OH promote diamond growth by dissolving graphite which might codeposit. In many ways, the OH radicals are similar to halogen atoms in that the oxygen containing radical is strongly electronegative, lacking one bonding electron to complete its outer shell. The OH radical can participate in the growth process both by chemically extracting H from the growth surface or by chemically dissolving the graphite. As a consequence of reduced loss rates and the cogeneration of OH species, the present invention hence does not rely on high-temperature physical or chemical sources to generate a sufficient atomic hydrogen population. Rather, it can use moderate or low-temperature physical or chemical sources to generate the atomic hydrogen population necessary to synthesize diamond. High-temperature sources could obviously be used to generate higher atomic hydrogen populations and produce higher deposition rates.

The present invention recognizes that discharges rich in oxygen (i.e., OH groups) can be used to deposit diamond. Accordingly, the present invention provides a new and improved process for the CVD growth of polycrystalline and homoepitaxial diamond films, which admits vapors of water and alcohol into a low pressure electric discharge to produce diamond growth. Addition of molecular hydrogen to the plasma discharge is not necessary for high quality diamond growth. Hence, the present invention differs quite remarkably from previous microwave work involving 0-6% water vapor in a $H_2/CH_4$ balance wherein the atomic hydrogen is supplied principally by dissociation of molecular hydrogen and the reactive species H and OH can diffuse rapidly in the molecular $H_2$-based process.

Thus, one preferred embodiment of the invention involves the substitution of water ($H_2O$) for molecular $H_2$ as the atomic hydrogen source. The water vapor in the discharge creates H atoms and OH radicals which can etch any graphite that might be codeposited with the diamond. The water vapor in the process significantly reduces the loss of atomic hydrogen from the growth environment. This reduces the power input necessary for diamond growth or allows higher populations of atomic hydrogen and OH to be obtained for any given power level.

The substitution of $H_2O$ for $H_2$ in the diamond growth process enormously simplifies the complexity of the growth process and growth system. It eliminates manufacturing costs associated with supplying large quantities of explosive, compressed gas ($H_2$, $CH_4$, etc.) to the manufacturing plant. It simplifies the gas delivery system by elimination of excess flow sensors and pressure regulators. It simplifies the gas manifolding by permitting the carbon sources to be mixed through volumetric dilution of alcohol and water. It reduces impurity contamination of the films from materials comprising the reactor construction by suppressing gas transport of these materials. Pure atomic hydrogen discharges permit chemical vapor transport of materials from the reactor to the film through the formation of volatile hybrids. This process is minimized by the OH presence which balances the reduction process through simultaneous oxidation. Oxides of steel, aluminum, and silicon are not volatile compounds.

The substitution of $H_2O$ for halogens or halocarbons in the diamond growth process also enormously simplifies the complexity of the growth process and the reactor. This substitution eliminates manufacturing costs associated with supply and disposing of large quantities of toxic or environmentally hazardous gases. By-products of the halogen-diamond chemistry are corrosive gases such as HF or HCl. Scrubbing and neutralization of acidic waste adds costs to the manufactured product. Corrosive gases require special materials of construction. Toxic gases require additional system costs for safety assurance. Government control of halogen consumption will likely impede their application to diamond growth.

Another preferred embodiment of the invention is the addition of acids such as acetic acid to the water mixture to provide a convenient source of atomic hydrogen. Acetic acid ($CH_3$ COOH) contains the COOH moiety whose COO—H bond strength is 1/10 the bond strength of HO—H. Thus, radicals of COOH in the plasma discharge will readily supply atomic hydrogen to the growth surface. Furthermore, halogenation of the acetic acid ($CH_2$ Cl COOH or CH $Cl_2$ COOH) weakens the COO—H bond even in the parent acetic acid group. Thus, the addition of chloroacetic or dichloroacetic acids to the growth process will further enhance the supply of atomic hydrogen through weakening of the COO—H bond.

To better appreciate these principles, we give the following examples: The bond dissociation energies for the molecular hydrogen dimer, H—H (104 kcal/mol), and water, HO—H (119 kcal/mol), are comparable and both OH and H can play the same roles in the diamond process. However, OH derived from a water discharge (plasma) is itself a long lived species and provides a long lifetime environment for other species. Thus, we have experimentally observed that the critical population of atomic hydrogen and OH required for high quality diamond growth from the water process can be achieved at significantly lower (5×) plasma powers and reactor pressures, as compared to molecular hydrogen based processes. The addition of acetic acid to the water base also allows through dissociation the production of COOH radicals in the plasma gas. The bond energy between the H atom and the COO—H unit is 12 kcal/mol. Recall that the bond energy appears in an exponential for dissociation. A factor of 9 change in an exponential represents an enormous rate enhancement in dissociation (approx 8000×). This water-acetic acid strategy thus exploits both lifetime and energy arguments. Further process enhancement can be obtained through the use of chloroacetic acid or even dichloroacetic acid. For those cases, the substitution of the more electronegative species (Cl) for hydrogen in the methyl group of the acetic acid molecule weakens the bond of the hydrogen in the OH group still more. This effect can also be seen in analogy to aqueous acids where the availability of hydrogen (dissociation constant) for the acids increases with replacement of H with Cl on the methyl group: acetic acid (0.00017); chloroacetic acid (0.0015); and dichloroacetic acid (0.050). These changes evidence themselves in the plasma power requirements. Discharges produced by pumping vapors from mixtures of 2:2:1 water to acetic acid to alcohol grow diamond at half the power level of discharges produced by pumping vapors from mixtures of 4:1 water to alcohol.

Furthermore, addition of acids to the water solution allows another convenient source of hydrogen atoms to be added to the growth process. Acids such as HCl in water solution transfer protons to adjacent $H_2O$ molecules to create $H_3O^+$ ions in solution. Acids could be added to the water-based process used for diamond deposition. While it is unclear if the hydronium ions will be pumped from the source, neutral HF and water molecules certainly will. HF has one of the strongest bonds of any diatomic molecule at 136 kcal/mol. One would not expect efficient dissociation. However, as in the acid solutions, the availability of lower energy sites on adjacent water molecules would allow proton transfer in the gas phase to occur upon collision of a HF and $H_2O$ molecule, thus producing hydronium ions $H_3O^+$. These ions like the water can provide H and OH to the growth process. These ions unlike the water have a very weak bond to the additional hydrogen atom, 1/20 of the bond strength of H—OH. The hydronium ion would then represent a low energy path for H dissociation. Like the organic acids, high dissociation constants will result in high concentrations of $H_3O^+$ ions in the liquid and subsequently in the gas phase. These $H_3O^+$ ions would readily supply H atoms and OH groups to the diamond growth surface.

In another preferred embodiment, addition of hydrogen peroxide or hydrazine to the water solution could also provide convenient sources for H and OH to the growth process. These compounds like acids are typically supplied from the manufacturer in a water-base. The water base stabilizes the compounds against spontaneous reactions at room temperature and pressures. The water base that is supplied by the manufacturer is clearly compatible with the water-based diamond growth reported in this invention. While the water base stabilizes these reactants ($N_2H_2$ and $H_2O_2$) at room temperature and pressure, introduction of these species into a plasma region should provide efficient generation of H and OH groups. The water base to the process as before will reduce gas-phase and wall recombinations.

In another preferred embodiment of this invention, alcohols such as methanol, ethanol, and isopropanol which are miscible in water provide carbon species necessary for growth. Pure water discharges which etch graphite to create gaseous carbon probably as CO or $CO_2$ do not deposit diamond on substrates adjacent to the graphite. Thus, in the water process, the alcohols are providing carbon necessary for diamond growth. Alcohols are merely fully saturated hydrocarbon chains terminated with OH. It is plausible that larger alcohols (which are not miscible in water) could be used to deposit diamond provided that the alcohols are metered into the chamber separately. Table I gives a list of alcohols that could be used for diamond growth. By diluting the larger alcohols in the gas phase with proportionately more water, the equivalent C/O ratio for the lower weight alcohols can be obtained. The alcohol-water system is a rather special system. Water $H_2O$ contains 2 of 3 atoms H. The common alcohols, methanol, ethanol, isopropanol follow the progression $CH_4O$, $C_2H_6O$, $C_4H_{10}O$, etc. For each of the alcohols, 2 of 3 atoms are H. It can be proven mathematically, but it is sufficient to note that any mixture of water and alcohol will correspondingly contain 66% of the atoms as H. Thus, dilution of the alcohols with water merely changes the C/O ratio. It can be shown that the C/O ratio in the gas phase varies as "n-xn" where "n"=1, 2, 3, etc. for methanol, ethanol, propanol, etc., respectively, and x is the percentage of water in the gas phase. The 80% water solutions used for demonstration of the invention result in water vapor concentration for methanol, ethanol, and isopropanol of 47%, 66%, and 83%, respectively. The C/O ratio is then 0.53, 0.68, and 0.51, respectively. Table I shows the range of water:alcohol ratios in the gas phase expected to give diamond growth for each of these alcohols.

Correspondingly, proper water dilution of hydrocarbons rather than alcohols could produce equivalent C/O ratio as the common alcohols. Thus, it is expected that hydrocarbons metered separate from the water into the reaction chamber could also be used in the present invention. The hydrogen atom content for hydrocarbon-water system will not be fixed at 66% as it is for the alcohol-water system. The hydrocarbons have a wide variety of $$\frac{H}{C + H}$$

ratios and do not contain oxygen. Listed below are some common hydrocarbons with the $$\frac{H}{C + H}$$

ratio.

| | |
|---|---|
| $CH_4$ | 0.80 |
| $C_2H_2$ | 0.50 |
| $C_2H_4$ | 0.66 |
| $C_2H_6$ | 0.75 |
| $C_3H_6$ | 0.66 |
| $C_3H_8$ | 0.72 |

Thus, as one mixes the hydrocarbons with water, there will be a linear progression from the water endpoint, 0.66, to the respective hydrocarbon endpoint, 0.80 in methane for example. In order for the water-base to be effective in reducing atomic hydrogen loss, the water must constitute at least 20% and preferably 40–80% of the gas phase. The percentage of water will directly effect the percentage of H in the gas phase and the percentage of oxygen in the gas phase. From the alcohol-water results, a C/O ratio of 0.55 yields high quality diamond growth. For $CH_4$-$H_2O$, this would require 65% $H_2O$ in the gas phase resulting in an hydrogen concentration of 73%. For $C_2H_2$-water a C/O ratio of 0.55 would require 78% water in the gas phase with a corresponding 62% hydrogen concentration. For the hydrocarbon-water system the C/O ratio is given by $$\frac{n(1 - x)}{x}$$

where "n" is the number of carbon atoms per hydrocarbon molecule and "x" is the percentage of water in the vapor phase.

It thus seems reasonable to expect, that since water-bases with hydrocarbons can provide the same hydrogen atom concentration at nearly the same C/O ratios, the water-hydrocarbon would be ideally suited for diamond growth. Table II gives a list of hydrocarbon that could be diluted with water in the gas phase to provide equivalent C/O ratios to the water alcohols. Table II also shows the H atom concentration of each of these hydrocarbons at the preferred C/O ratio of 0.55. Note that the hydrogen atom content is within a few percent of 66%, the hydrogen-atom content for all the water-alcohols.

The water-alcohol process of the present invention expands acceptance of the diamond CVD technology into areas where traditionally the expense and hazards of diamond CVD would have precluded its use. For example, small job shops may invest in a diamond CVD tool for refinishing diamond tools purchased from tool suppliers. In another example, the reducing atmosphere of the plasma discharge may provide an effective means of refinishing and sterilizing expensive diamond medical tools before each surgery. For example, the reducing atmosphere of the plasma discharge may be an effective way to clean diamond optics that may have become contaminated in service.

In a preferred embodiment of the invention, CVD diamond growth from water/alcohol vapors has been demonstrated in a low-pressure, confined rf discharge. The vapors 30–40% alcohol in water content are admitted at 20 sccm into a plasma discharge. Pressure is maintained at 1.0 Torr through automatic control of a butterfly valve controlling the conductance to a turbomolecular pump. Methanol, ethanol, and iso-propanol mixtures have been demonstrated. The confined rf discharge produces efficient dissociation of the $H_2O$ molecules into OH and H groups. Emission from the plasma region shows atomic H and OH emission lines. Both polycrystalline and homoepitaxial diamond deposition have been demonstrated by this technique. Films deposited by this technique have been principally characterized by scanning electron microscopy (SEM) and Raman scattering spectroscopy. Both techniques attest to diamond synthesis by this process.

Described above are a number of process variations, including (1) water/alcohol discharge, (2) water/alcohol plus acetic acid discharge, (3) water/alcohol plus chloroacetic acid discharge, (4) water/alcohol plus dichloroacetic acid discharge that allow a steady reduction in process energy requirements. The steady reduction in process energy is a consequence of low loss rates of atomic H, cogeneration of OH, and generation of atomic H from sources whose bond-strength to the atomic H is considerably weaker than the molecular $H_2$ bond strength. There are numerous alternative choices for both the carbon source and for the hydrogen analogue once the basic principle is recognized. As a further example of the range over which these principles can be extended consider the following. As an alternative low-temperature source for an OH-based chemistry, hydrogen peroxide, $H_2O_2$, can be catalytically decomposed (Ag or Pt) or reacted at room temperature. Hydrazine, $N_2H_2$, either alone or in combination with $H_2O_2$ can be used as an exothermic hydrogen source. These low-temperature H and OH sources could be combined with more reactive carbon precursors such as a haloacetylene, (Cl—C≡C—Cl) to provide both etchant and carbon source species to the growth process. Moderation of these exothermic sources would occur quite conveniently by water moderation. Hydrogen peroxide is bottled in 75% water to stabilize the structure at room temperature. Hydrazine $N_2H_2$ is rocket fuel in concentrated form but is not explosive at 30% concentrations in $H_2O$. For diamond coatings at reduced temperatures the low-temperature-sources would enable coating of diamond to be deposited at fairly low temperatures on sensitive parts such as plastics. The current molecular $H_2$-based processes preclude low temperature growths (<100° C.) due to inadvertent heating of the substrate from the high temperature sources.

The water-based processes with the exothermic sources according to the present invention have the capability of performing extremely low temperature growths perhaps below 100° C. depending on the physical limitations related to impurity atom (in particular O and H) elimination from the diamond crystal. Since diamond growth has been reported at temperatures as low as 135° C. by Prof. Komiyama at Tokyo University [see Diamond Depositions: Science and Technology, 15, (August 1991)], it is clear that impurity atom elimination in this low temperature range is possible. There are two mechanisms for O and H elimination from the diamond crystal as it is growing. One mechanism is purely thermal desorption of O and H terminating species from the growth surface. The other mechanism is chemical extraction of O and H terminating species from the growth surface. The former mechanisms occur at temperatures above 600° C. and hence will not be active at low temperatures. The chemical extraction mechanisms, while not documented for diamond, have been studied for extraction of H from Si(100) surfaces. These mechanisms have activation energies less than 20 kcal/mol and hence are active even at low temperature.

Besides elimination of atomic impurities such as O and H, the water-based process must also eliminate water from the growth surfaces. Water can physisorb at low temperatures to inhibit diamond film growth by obscuring the diamond surface from carbon radical addition. The thermal desorption of physisorbed water from metals such as stainless steel and aluminum has been studied. Water desorbs from these surfaces at temperatures above 55° C. [see S. J. Pang et al. in J. Vac. Sci. Technol. A5, 2516]. A maximum is observed at 85° C. Growth of diamond at temperatures greater than 55° should not be inhibited by water physisorption on the growth surface and is thus conceivably possible.

TABLE I

| Fully Saturated Alcohols | | Demonstrated C/O Ratio* | Preferred C/O Ratio* |
| --- | --- | --- | --- |
| Methanol | $CH_4O$ | 0.53 | 0.55 ± 0.20 |
| Ethanol | $C_2H_6O$ | 0.68 | 0.55 ± 0.20 |
| Propanol | $C_3H_8O$ | 0.51 | 0.55 ± 0.20 |
| Butanol | $C_4H_{10}O$ | — | 0.55 ± 0.20 |
| Pentanol | $C_5H_{12}O$ | — | 0.55 ± 0.20 |
| Hexanol | $C_6H_{14}O$ | — | 0.55 ± 0.20 |
| Octanol | $C_7H_{16}O$ | — | 0.55 ± 0.20 |

TABLE II

| Hydrocarbons | | Preferred C/O Ratio* | H Atom Content |
| --- | --- | --- | --- |
| Methane | $CH_4$ | 0.55 | 73% |
| Acetylene | $C_2H_2$ | 0.55 | 62% |
| Ethylene | $C_2H_4$ | 0.55 | 66% |
| Ethane | $C_2H_6$ | 0.55 | 70% |
| Propane | $C_3H_8$ | 0.55 | 71% |

*C/O ratios are for the vapor phase concentrations of water solutions

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
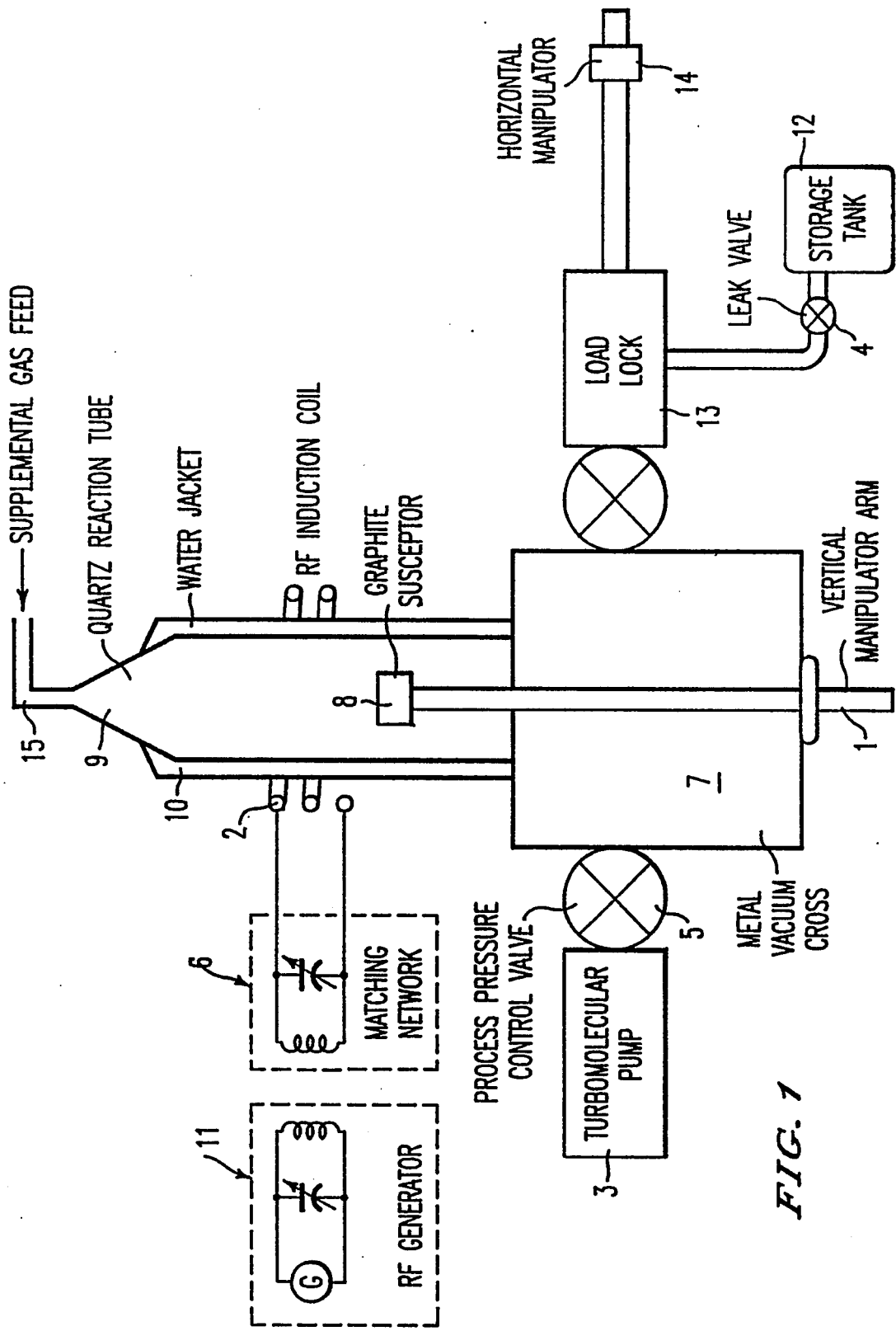
FIG. 1 is a schematic illustration of the isolated rf coil apparatus for producing diamond films according to the present invention.

Referring now to the drawings, wherein like reference numerals designate identical or corresponding parts throughout the several views, and more particularly to FIG. 1 thereof, a preferred embodiment of the apparatus of the invention is a low pressure rf-plasma system including a vacuum vessel connected to a plasma tube upon which rf induction coil is wound. The apparatus allows samples to be introduced into the vacuum system and through a vertical manipulator arm (1) positioned just beneath the rf induction coil (2). The turbomolecular pump (3) on the apparatus allows the system to be thoroughly evacuated prior to introduction of the process gas. Typically, the vacuum vessel is evacuated to $10^{-7}$ Torr before introduction of the process gas. Once the sample is in position, the process gas mixture is admitted into the chamber through a leak valve (4) at a rate of approximately 20 sccm. A process pressure control valve (5) located in front of the turbomolecular pump (3) restricts the pumping to allow the pressure in the chamber to be maintained at 1.0 Torr during diamond deposition. To initiate diamond deposition, a 13.56 MHz rf signal is supplied to the rf induction coil (2). The configuration of the matching network (6) allows a controllable power density confined rf plasma to be maintained inside the coil, within the tube. Consequently, the gas mixture is dissociated liberating atomic hydrogen and molecular OH groups as well as CH groups from the alcohols. Both atomic hydrogen and OH can dissolve graphite from the surface of the depositing diamond permitting the diamond phase to be stabilized.

Furthermore, the rf-plasma system of the present invention has the unique property that the plasma is confined within the rf induction coil (2) which is used to excite the plasma gas. This confinement is accomplished by a matching network, (6) whereby the rf-coil is electrically isolated from ground, via transformer coupling. Thus, the center of the rf-plasma coil appears as a virtual ground. Conventional configurations connect one side of the rf coil to ground, and the coil no longer confines the rf discharge. The discharge extends from the coil region toward the metal vacuum cross (7) also at ground reference. In this configuration, application of higher power input results in excitation of a larger volume of gas. Consequently, the gain in power density is sub-linear. However, when using the confined discharge configuration any increase in power maintains approximately the same excitation volume resulting in a linear increase in power density with applied power.

The chemical vapor deposition apparatus includes a typical metal vacuum cross chamber (7) upon which vacuum gauging, vacuum pumping, gas introduction, sample introduction, and the plasma-quartz-tube are assembled. Samples introduced into the CVD system are inserted into the plasma-quartz-tube just beneath the rf induction coil (2). Samples are located on a graphite susceptor (8) which heats from currents induced in the graphite by the high ac magnetic field in the rf induction coil (2). The quartz reaction tube (9) is a 50 mm i.d. quartz tube with integral water cooling jacket (10). The rf induction coil (2) is powered by a 13.56 MHz rf generator (11). A three-turn coil in parallel with a vacuum capacitor-resonant at 13.56 MHz comprises the rf matching network (6). The matching network is isolated from ground and is principally inductively coupled to the rf generator (11). The high value of shunt capacitance, and the low impedance of the rf coil produce relatively high circulating currents from large differential voltages across the coupling network and rf coil. These high circulating currents create a very strong ac magnetic field which permits effective induction coupling to the low impedance plasma, thereby creating a high or low density plasma gas (as desired) which can effectively dissociate the water and alcohol vapor mixture.

Preparation of the gases used in practicing the present invention was performed by mixing the water alcohol solutions in a holding container. Another evacuated vessel, the storage tank (12), was submerged in the holding container, then opened to draw the water alcohol mixture into the tank, and then closed to allow transport of this vessel to the growth reactor. Once installed on the growth reactor, the connecting lines were evacuated by opening a leak valve (4) to the pump (3). At that point the leak valve (4) was closed, the storage tank was opened, and the gas mixture equilibrated to the leak valve. The leak valve was opened to admit the water/alcohol mixtures into the vacuum chamber. Typically, the procedure after installation of the storage tank (12) on the system load lock (13) was to pump through the leak valve for 30 minutes before setting the pressure in the chamber for diamond growth. Samples introduced into the load lock prior to installation of the water-based solutions are transferred via a horizontal manipulation arm (14) into the growth chamber. For growths using $H_2/CH_4$, the premixed gas enters the growth reactor through the supplemental gas feed (15). This procedure eliminates any air that might have been trapped during the filling of the transfer vessel.

The water/alcohol vapor process, preferred embodiment of the present invention, is operable in other electric discharges where there is sufficient power density capable of efficiently dissociating the water molecules. Indeed, given that the bond strength of the O—H bond in water is comparable to the bond strength of H—H in molecular $H_2$ and given that the water molecule has a larger physical and electronic collision cross-section, the water process will grow diamond at reduced power densities than is required by the molecular hydrogen based process. Thus, the present process is applicable to other diamond producing discharges, e.g., microwave, electron cyclotron resonance (ECR), dc plasma, dc arc jets, hot filaments, etc.

The rf induction plasma is a fairly common mode by which plasma enhanced chemical vapor deposition is driven in many materials deposition systems. However, in the deposition of many materials, one typically is not attempting to stabilize the metastable phase of the material. It has been shown that the stabilization of diamond can be attributed to a codeposition process that involves both the deposition of diamond and graphite with the dissolution of graphite from the surface. In many diamond deposition techniques, workers have proposed that the production of atomic hydrogen or fluorine as active agents responsible for the dissolution of graphite. In those systems, the production of atomic hydrogen or atomic fluorine is accomplished with the use of a high temperature zone via chemical flame, hot filament, or plasma. These environments are hot with respect to the dissociation of the radical that one is attempting to produce. Atomic hydrogen requires a characteristic temperature in excess of 2300° K. in order to efficiently be dissociated. Fluorine, on the other hand, requires a much lower characteristic temperature over 1000° K. Generally, the hotter the characteristic temperature of the flame or discharge or filament the more efficient the atomic hydrogen generation will become. There are frequently real constraints which limit the temperature of the flame or plasma and, thus, limit the atomic hydrogen production. In the low pressure regime of this work (around 1.0 Torr), the plasma is not confined by pressure damping effects. It is quite common for low pressure discharges to extend over large areas and volumes. For some processes, this is highly desirable. Unfortunately for the growth of diamond from traditional molecular $H_2$-based process, one needs to effectively produce the atomic H species capable of dissolving graphite. This requires high power density plasmas. To overcome this limitation, the present invention uses the above described rf matching network wherein the rf coil is electrically isolated from ground potential through the use of transformer coupling. As a consequence, there exists no high rf potential between the coil and chamber ground, and the plasma remains confined within the coil. Thus, power input into the coil linearly scales the power density to the discharge gas. Hence, the present system is capable of diamond growth from both molecular $H_2$-based processes and water-based processes. The system thus allows a valid comparison between the two processes. The location of the sample on the graphite susceptor outside the coil area results in the intense power coupling to the gas rather than to the induction of excess rf currents in the graphite susceptor.

Besides isolated inductive coupling, other means could be used to couple radio frequency energy into the reactant gases. Any means by which the necessary transferred power density is achieved would be suitable provided it can be physically implemented without compromising the process chemistry or reaction kinetics. Potentially suitable mechanisms would employ radio frequency circuits possessing various special properties such as a high "Q" factor, (the ratio of stored energy to dissipated energy in the circuit), where such properties are necessary to realize the before mentioned transferred power density. A sufficiently high transferred power density might be achieved, for example, by a high "Q" resonant transmission line segment coupled capacitively to the reactant gas species. Another mechanism might involved the use of a resonant cavity coupled both inductively and capacitively to a reactant gas stream. Pursuing these ideas further, a high "Q" resonant transmission line segment might be coupled resistively to a reactant gas volume. Examples of these coupling schemes are shown respectively in FIGS. 2, 3, and 4. Other transmission line segments might also be employed for the purposes of generating high "Q." FIGS. 2, 3, and 4 merely illustrate several approaches to the application of high "Q" transmission lines for power coupling to the plasma. In these example cases, the circuit dimensions would be chosen to be equal to some proportion to the wavelength of the particular radio frequency that is to be used. For 13.56 MHz, this would constitute some proportion of 22 m. For 81.36 MHz, this would constitute some proportion of 3.7 m.

The principal dimensions of such transmission lines and resonant cavities will depend on dimensions W, P, C, L, $C_1$, $C_2$, and D. W is a value generally small in proportion to L. P is a coupling adjustment, varied to secure best power transfer to plasma gas. $C_1$ and $C_2$ are also coupling adjustments varied to secure best power transfer to plasma gas. L is a length characteristic of operating frequency. Normally $$L = kn\left(\frac{v\lambda}{4}\right)$$

where k is a constant of proportionality normally equal to 1, and n is an integer 1, 2, 3, etc., and $\lambda$ is the free space wavelength of the frequency chosen, and v is a velocity factor, dependent upon transmission line dimensions and materials of construction. $C_1$, $C_2$, and D are varied to produce best power transfer to plasma gas.

Figure 2:
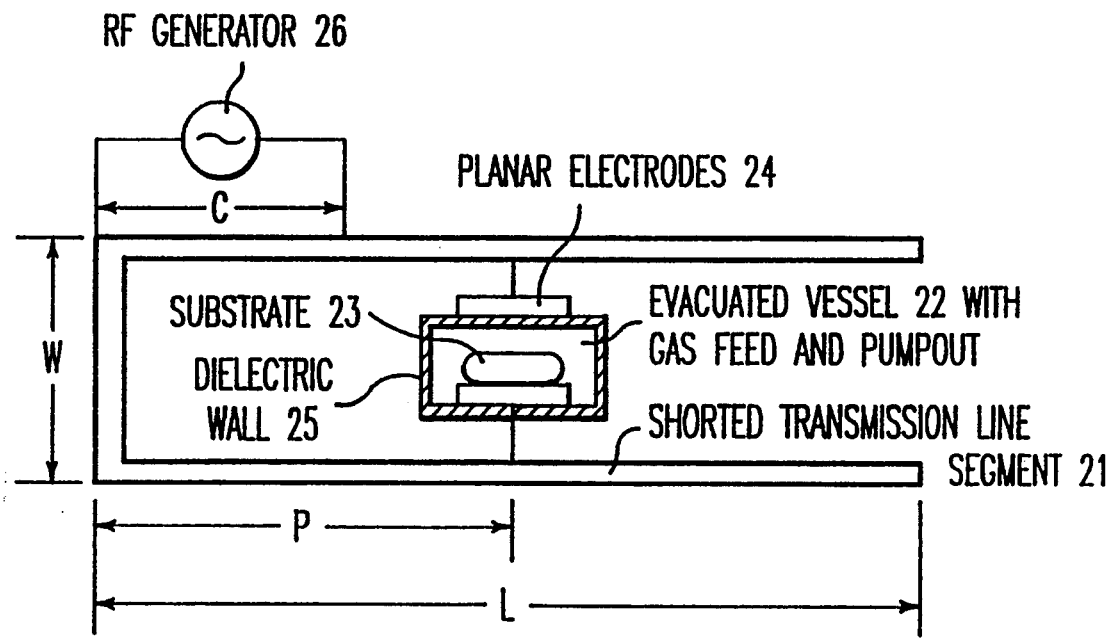
FIG. 2 is a schematic illustration of the resonant transmission line capacitive coupling apparatus for producing diamond films according to the present invention.

In FIG. 2, a resonant transmission line segment is shown with capacitive coupling to the plasma gas. The shorted transmission line segment (21) is electrically connected at some point P which load matches the plasma impedance to the I-V relationship on the shorted transmission line. The plasma is contained in an evacuated vessel (22) to be backfilled with the aforementioned reactant gases. The substrate (23) rests on one side of the parallel plate arrangement defined by the planar electrodes (24). The planar electrodes are in physical contact to a dielectric wall (25) to prevent electrical breakdown of the applied fields and the consequent shorting of the transmission line segment. An rf generator (26) is connected according to FIG. 2 at some point C to secure optimum power transfer to the transmission line segment (24).

Figure 3:
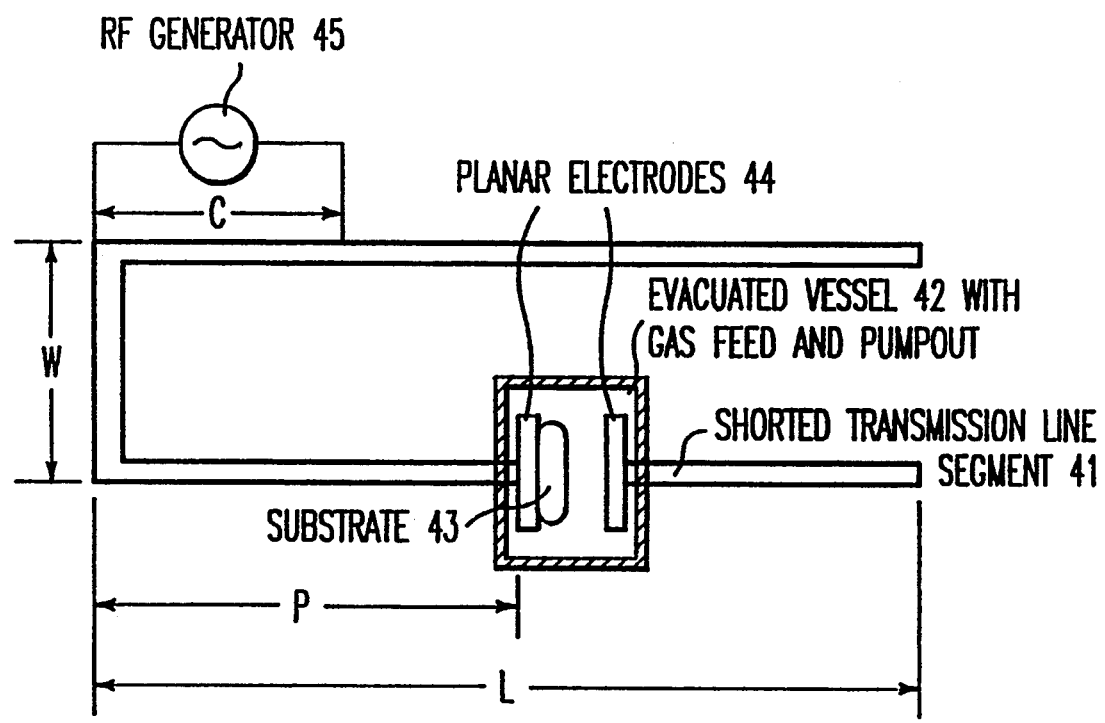
FIG. 3 is a schematic illustration of the resonant transmission resistive coupling apparatus for producing diamond films according to the present invention.

In FIG. 3, a resonant transmission line segment is shown with resistive coupling to the plasma gas. The shorted transmission line segment (41) is electrically connected at some point P which load matches the plasma impedance to the I-V relationship on the this line. The plasma is contained in an evacuated vessel (42) to be backfilled with the aforementioned reactant gases. The substrate (43) rests on one side of the parallel plate arrangement defined by the planar electrodes (44). The planar electrodes are in physical contact with the plasma gas allowing current flow to occur through the gas. An rf generator (45) is connected according to FIG. 3 at some point C to secure optimum power transfer to the transmission line segment (41).

Figure 4A:
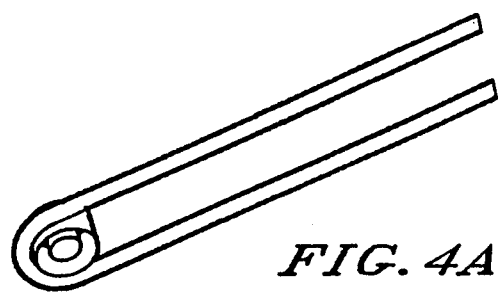
FIG. 4 is a schematic illustration of the resonant transmission inductive coupling apparatus for producing diamond films according to the present invention.
Figure 4B:
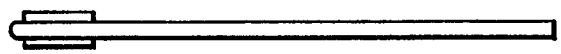
Figure 4C:
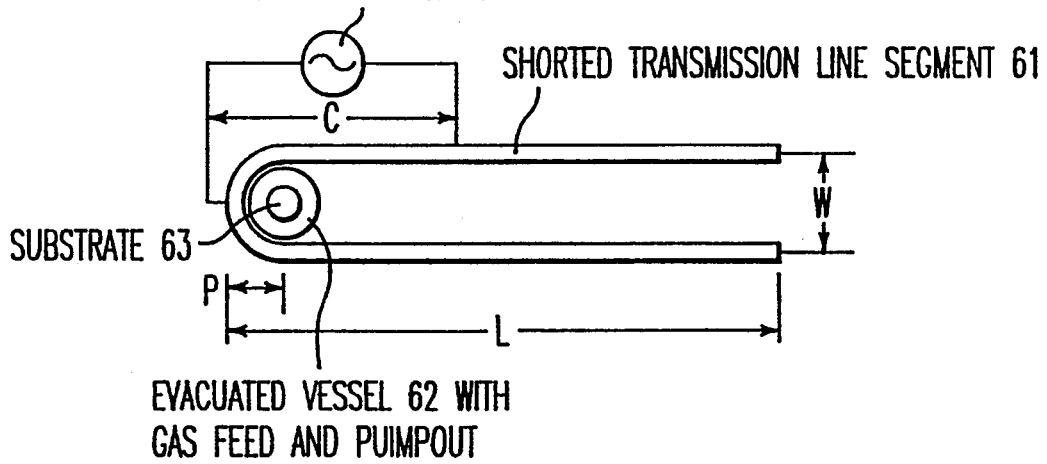

In FIG. 4, a resonant transmission line segment is shown inductively coupled to the plasma gas. The shorted transmission line segment (61) passes around an evacuated vessel (62) with gas feed and pump out. The substrate (63) rests on a stage within the evacuated vessel (62). The walls of the evacuated vessel are such as to permit very strong ac magnetic fields associated with the high circulating currents in the shorted transmission line segment (61) to induction couple power to the low impedance plasma. An rf generator (64) is connected according to FIG. 4 at some point C to secure optimum power transfer to the transmission line segment (61).

Figure 5:
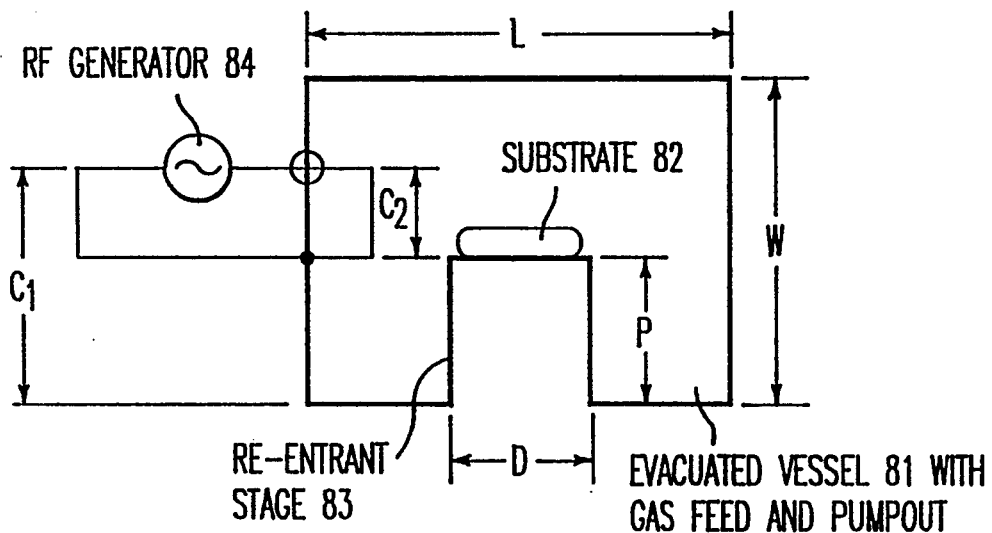
FIG. 5 is a schematic illustration of the rf resonant cavity coupling apparatus for producing diamond films according to the present invention.

Another means of obtaining efficient power transfer to the plasma gas would be to employ resonant cavities wherein the frequency and physical size of the chamber would be appropriately matched. For rf frequencies, this would require large volume chambers. As the field of diamond depositions proceeds, large area diamond deposition will be required for economy of scale. Such rf resonant cavities of dimensions >4 m would differ considerably in size from microwave resonant cavities currently used for small area diamond deposition. Hence for large-are diamond deposition, these dimensions would be appropriate for producing uniform deposits over large areas. FIG. 5 illustrates the proportioning and sizing of a rf resonant cavity.

In FIG. 5, a rf resonant cavity approach is used to couple power to a plasma gas. A resonant cavity comprising the evacuating vessel (81) is used with appropriate cavity dimensions L, D, $C_1$, $C_2$, and W to provide coupling to the plasma gas. The substrate (82) is located on a reentrant stage (83). The rf generator (84) is coupled to the resonant cavity at points defined by the dimensions $C_1$ and $C_2$. Other resonant cavity structures are possible. FIG. 5 represents an illustrative example of how a resonant cavity could be implemented.

The gas mixture according to the present invention are mixtures of water and alcohols. It has been found that addition of organic acid groups to the water also provides a convenient source of atomic hydrogen to the growth process. Alcohol serves as a convenient source due to its miscibility in water. For demonstration of the invention, volume mixtures of 20% methanol in water or 20% ethanol in water or 20% isopropyl in water have been used. Following deposition these films were examined using a scanning electron microscopy (SEM) and Raman spectroscopy (see FIG. 2, discussed hereinafter). These techniques show conclusively that the films are diamond. The morphology of films deposited on silicon substrates show the well defined crystals constituting a polycrystalline film. The full-width-half-maximum (FWHM) is 5 cm$^{-1}$, typical for polycrystalline material. On a diamond substrate, a homoepitaxial diamond film has been deposited whose FWHM was 2.60 cm$^{-1}$ consistent with the FWHM of the starting substrate whose valve was 2.75 cm$^{-1}$. Furthermore, it has been found that at low temperatures ($\sim$350° C.) and with acetic acid addition to the water/alcohol mix, diamond can be grown on Si(100) substrates with a FWHM of 2.9 cm$^{-1}$, comparable to that of natural crystals.

Next described is the process according to the present invention for the chemical vapor deposition of diamond. Diamond has been deposited from plasma discharges of water/alcohol on diamond and non-diamond substrates. Both polycrystalline and single crystalline films have been deposited. As previously noted, the process in essence uses water to replace molecular hydrogen as the source of atomic hydrogen for diamond deposition. As a consequence, both atomic hydrogen and OH radicals are present at the growth surfaces to dissolve graphite and promote diamond bonding. As discussed in the invention summary, the water-base to the process (40–80% $H_2O$ in the gas phase) significantly reduces atomic H loss mechanisms by (1) Slowing diffusion of H from reaction point. Diffusion of H in $H_2O$ vapor should be 20% slower than the diffusion of H in $H_2$.

(2) Complexing of H atoms (ions) with $H_2O$ to form hydronium ions further reduces diffusion. Diffusion of $H_3O^+$ in $H_2O$ should be 3.72 times slower than the diffusion of H in $H_2$.

(3) Water passivation of the tube walls to reduce wall recombinations.

The replacement of molecular $H_2$ with water provides the plasma with a molecule whose cross-section for electron impact is much larger than $H_2$. The plasma will be more efficient in water dissociation than $H_2$ dissociation. As a consequence, the power requirements as observed in the present invention is 4 times lower for the water-based process than the molecular $H_2$-based process. Higher powers could of course be used in the water process to generate even higher atomic H and OH concentrations for comparable power levels. The replacement of molecular hydrogen with water as the atomic hydrogen source has enormous ramifications toward the production of lower-cost diamond. It eliminates the expensive overhead associated with the storage and delivery of copious amounts of molecular hydrogen. It eliminates the explosive hazards associated with molecular hydrogen. It eliminates the necessity for expensive vacuum pumps designed to eliminate water vapor from many growth environments.

In a preferred embodiment of the process of the present invention, water is mixed with alcohol, wherein the alcohol supplies the carbon necessary for diamond deposition. Alcohols provide a convenient carbon source which can be mixed with water and, thus, eliminating gas manifolding. Other organics, hydrocarbons, and halocarbons could be used as well as the alcohol. About 20 sccm–30 sccm of water vapor/alcohol mixture is leaked into the growth chamber in which the chamber pressure is maintained at 1.0 Torr. An rf plasma of $\sim$500 W is maintained for 2–5 hours at a sample temperature of approximately 625° C. It is anticipated that conditions substantially different from these can also produce diamond deposition. Table III lists ranges of parameters wherein it is expected that water/alcohol solutions could be expected to deposit diamond. Tables I and II in the invention summary listed alcohols and hydrocarbons that could be used in the present invention along with their gas-phase ratios to water. It is anticipated that the same proportions for analogous halocarbons could be used.

To demonstrate the importance of the water vapor to diamond deposition, a sample was deposited using pure methanol. Only a few nucleation sites were observed. The crystals were not well faceted and appeared to have a substantial amount of non-diamond bonding. The water promoted both the nucleation and the quality of the depositing diamonds. To illustrate the importance of the alcohol to the growth process, growths at less than 20% alcohol by volume liquid in the storage tank have not produced any growth.

TABLE III

| Parameter | Range | Preferred Range |
|---|---|---|
| Substrate Temperature | 55–1000° C. | 135–650° C. |
| Pressure | 0.005–760 Torr | 0.10–10.0 Torr |
| Water Concentration* | >20% | 40–80% |
| Alcohol Concentration* | See Table I | |
| Hydrocarbon Concentration* | See Table II | |

*gas phase

It is interesting to compare the conditions of diamond growth in this reactor for the water/alcohol to the conditions of diamond growth in this reactor for the more conventional $CH_4/H_2$. If conditions producing comparable quality diamond at nearly the same rate are considered, than the advantages of the water/alcohol become more apparent.

| Parameter | Water/Alcohol | $H_2/CH_4$ |
|---|---|---|
| pressure | 1.0 Torr | 5.0 Torr |
| temperature | 625° C. | 850° C. |
| power | 600 W rf power | 2400 W rf power |
| flow rate | 20 sccm | 15 sccm |
| composition | 40% alcohol in vapor | 1% $CH_4$ in vapor |

Thus, the conditions for the water-alcohol are at reduced pressure, lower temperature, and reduced power. Furthermore, the water/alcohol work has been extended to even lower growth temperatures through the addition of acetic acid. Growth at 300°–400° C. is possible from 2:2:1 $H_2O$:$CH_3COOH$:$CH_3OH$ mixtures.

Optical emission from the water vapor alcohol plasmas shows a 656 nm atomic hydrogen emission as well as OH emissions. No evidence for atomic oxygen emission was seen. It appears that the plasma is dissociating the water molecule into H and OH, without significant dissociation of the OH group to produce atomic oxygen.

The propensity of the water discharge to produce etchant species for graphite has been confirmed. Graphite dissolution has been measured for the water-based verses the molecular $H_2$-based processes. The water/alcohol mixtures according to the present invention deposit diamond at 0.5 $\mu$m/hr and etch graphite at 25–50 $\mu$m/hr. The samples (located on the graphite susceptor during growth) mask the graphite allowing measurements of the graphite dissolution rate while the samples give a measure of the diamond deposition rate. $H_2/CH_4$ discharges also etch the graphite, but only at about 0.5 $\mu$m/hr. The factor of nearly 100 reflects significant differences in the water process over the $H_2$ process. The OH radicals are very efficient in gasifying graphite. It is important to note that carbon gasified from the graphite susceptor is not being incorporated into the diamond film. Thus, the by-products of the graphite etching are inert to the diamond growth.

Figure 6:
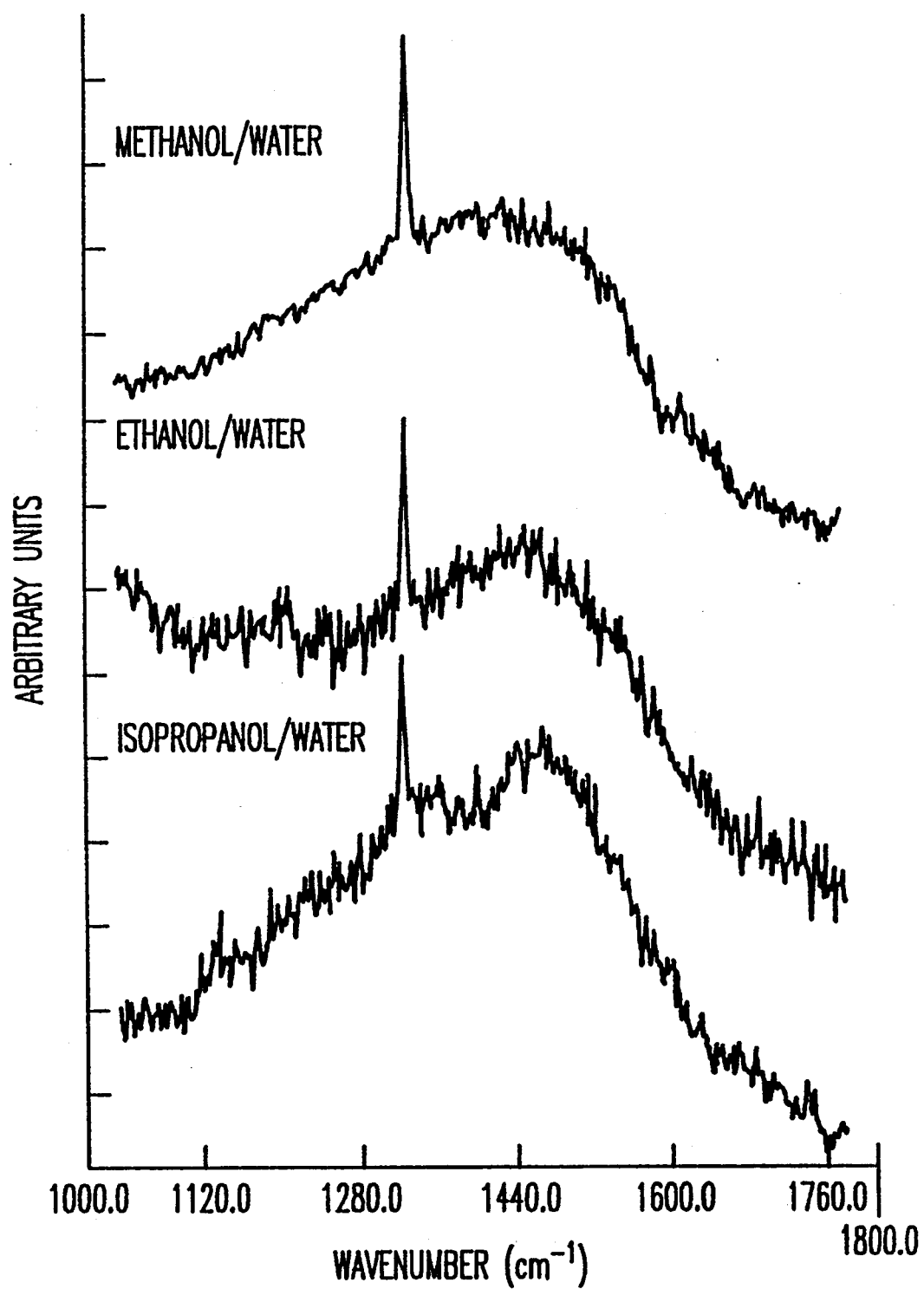
FIG. 6 is a graph showing the Raman spectra from three films grown with water/methanol, water/ethanol, and water/isopropanol.

FIG. 6 is a graph showing the Raman spectra from three films grown with water/methanol, water/ethanol, and water/isopropanol. The films show a dominant 1332 cm$^{-1}$ scattering line indicative of diamond. It should be emphasized that the quality of the diamond growth for different alcohols will need to be optimized for each water-alcohol mixture. FIG. 2 merely shows that diamond growth is possible from these water/alcohol mixtures.

Figure 7A:
FIG. 7 shows SEM photographs of the polycrystalline diamond films produced by the three different water/alcohol compositions noted with respect to FIG. 6.
Figure 7B:
Figure 7C:
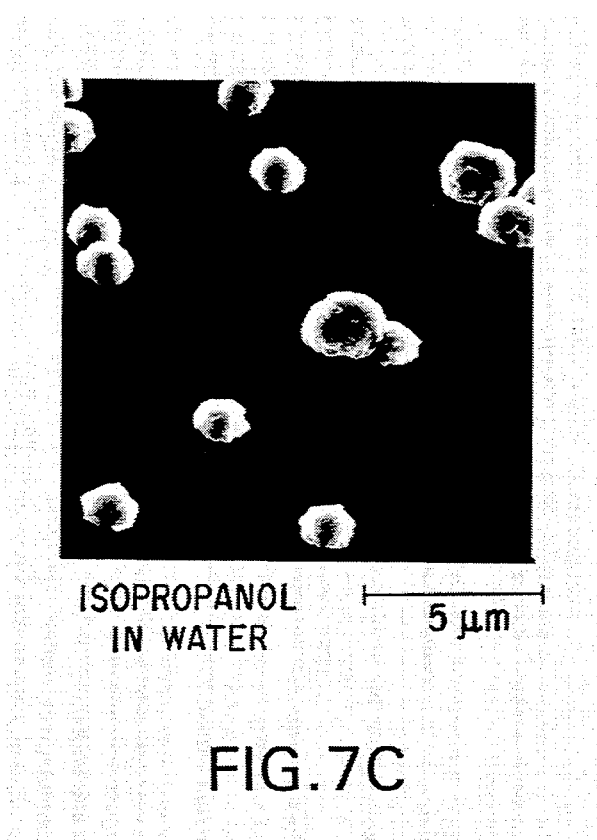

FIG. 7 shows SEM photographs of the polycrystalline diamond films. The crystalline habit and the nucleation density appears to be highly dependent on the alcohol choice. These films were deposited on Si(100) substrates whose surfaces had been treated with graphite fibers prior to insertion into the growth reactor. This technique has been successful in enhancing diamond nucleation under more conventional growth gases such as 1% $CH_4$ and $H_2$. The surface topographies of the diamond films shown in FIG. 7 are a consequence of the nucleation density which is comparable to many other growth techniques.

Figure 8A:
FIG. 8 shows Raman data for diamond growth on a natural diamond crystal.
Figure 8B:
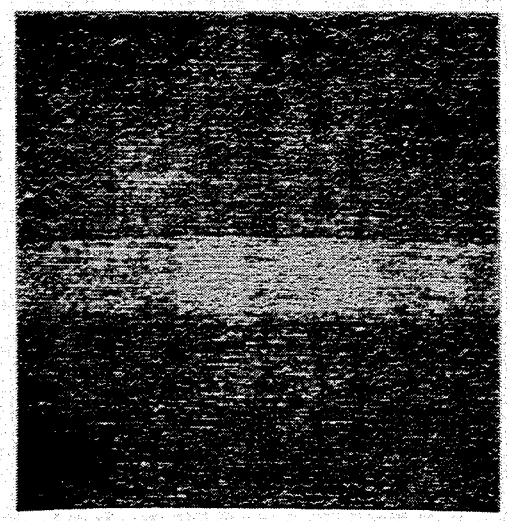
Figure 9A:
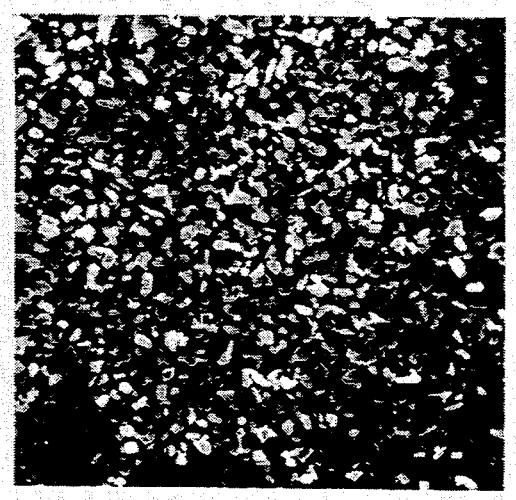
FIGS. 9 and 10 illustrate SEM micrographs and Raman spectrum, respectively, of diamond films deposited according to a further embodiment of the present invention regarding acetic acid addition to the diamond growth.
Figure 9B:
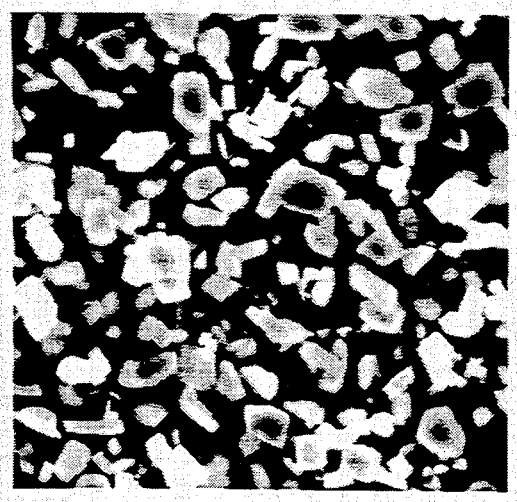
Figure 9C:
Figure 9D:

Besides the production of polycrystalline diamond films, homoepitaxial layers have been deposited using water/methanol and water/ethanol. The ethanol sample had the cleanest topography. Raman analysis of the deposited layer showed a very narrow FWHM comparable to the starting substrate. No amorphous carbon or graphite was detected. Growths on natural diamond crystals produce relatively smooth homoepitaxial diamond films. FIG. 8 shows Raman data from growth on a natural diamond crystal. Micro-focus Raman is used to examine the near surface of the deposited film. It has a FWHM of 2.6 cm$^{-1}$ as compared to the substrate of 2.75 cm$^{-1}$. It thus appears that the growth from water/ethanol is a higher quality than the original substrate. FIG. 8 also shows a SEM photograph of the diamond epitaxial surface. The surface shows a slightly modeled texture, i.e., an apparent variation in contrast as observed by the SEM due to long angle boundaries in the materials, but shows no features associated with a polycrystalline growth.

Figure 10:
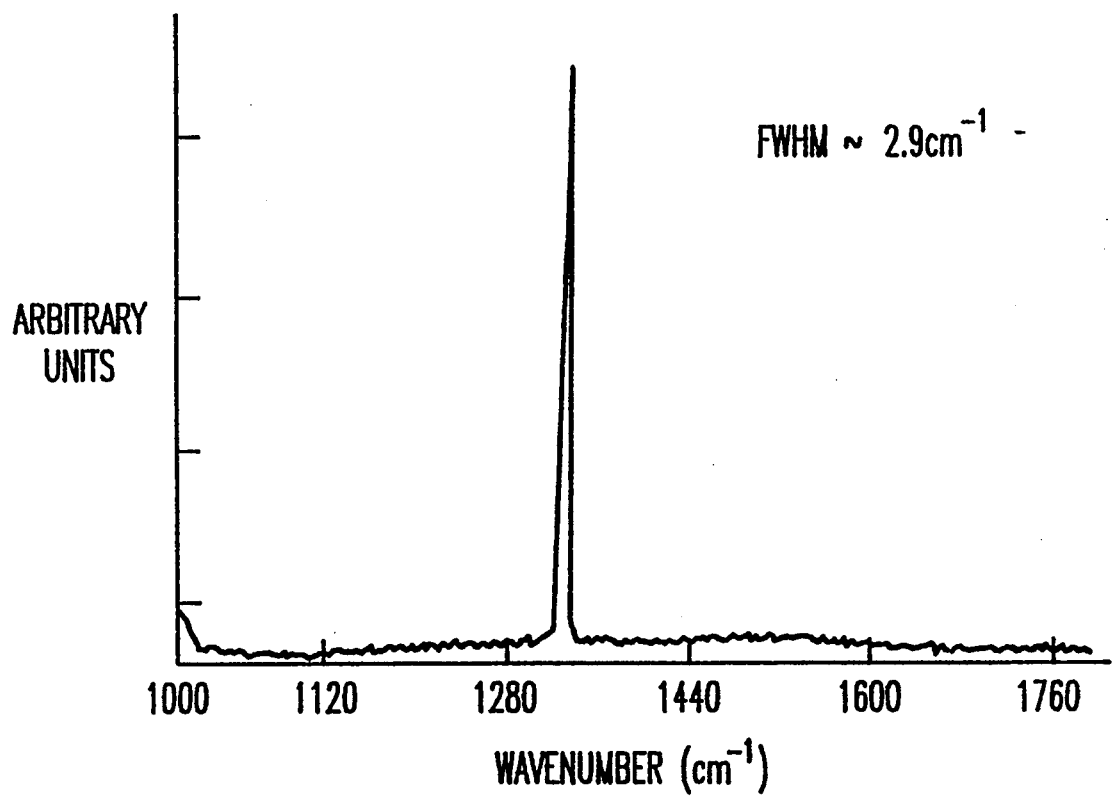

As discussed in the invention summary, organic acids can be added to the water/alcohol solutions to further enhance diamond growth. Acetic acid $CH_3COOH$ has been added to the water/methanol solutions. Given the close chemical constituency of acetic acid, $CH_3COOH$, and methanol, $CH_3OH$, solutions of only water and acetic acid were evaluated for diamond growth. No deposition was observed. Solutions from 20–80% acetic acid in water were tested. The addition of the acetic acid to the water did, however, lowers the power level necessary to obtain strong OH and atomic H emission. It is postulated that acetic acid addition provides a ready source of H atoms through e-impact dissociation of the $CH_3COO$—H bond. Hence, mixtures of acetic acid, water, and methanol should provide diamond growth at even lower power levels. Indeed diamond growths have been accomplished at approximate power levels of 300 W for the acetic-acid:water:methanol as compared to 600 W for the water:methanol. The reduced rf power input also permits the diamond growth to occur at even lower temperatures. FIG. 9 shows a SEM micrograph of diamond crystals deposited at 350° C. using acetic acid, water and methanol. The crystals show a very different morphology with habits that are not isotropic. It is believed that at low temperatures passivation by OH or H on perhaps one of the major crystal planes inhibits propagation of that major plane resulting in anisotropic growth. FIG. 10 shows the Raman spectrum from the sample shown in FIG. 9. It shows no appreciable amorphous component and an extremely sharp 1332 cm$^{-1}$ Raman line.

Obviously, numerous modifications and variations of the present invention as described herein are possible in light of the above teachings. It is therefore to be understood that within the scope of the appended claims, the invention may be practiced other than as specifically recited therein.

What is claimed as new and desired to be secured by Letters Patent of the United States is:

1. A water-based process for depositing diamond on a surface of a substrate, comprising:
   producing in a chamber enclosing the substrate a gas phase mixture constituting by volume percentage at least 20% water vapor, an acid selected from the group consisting of an organic acid and an inorganic acid, and a carbon precursor containing compound;
   dissociating said gas phase mixture to produce dissociated OH and H species and carbon species, wherein during dissociating said acid enhances promotion of atomic hydrogen by ready dissociation of COO—H bonds when the organic acid is used and dissociation of H$^+$—H$_2$O hydronium bonds when the inorganic acid is used; and
   supplying said dissociated OH and H species and said carbon species to said substrate and growing a diamond film having a dominant 1332 cm$^{-1}$ Raman peak on the surface of said substrate.

2. A water-based process according to claim 1, comprising:
   selecting an amount of said carbon precursor containing compound to yield a C/O ratio in the gas phase from 0.40 to 0.80.

3. A water based process according to claim 1, wherein said producing step comprises:
   producing said gas phase mixture constituting by volume percentage 40–80% water vapor.

4. A water-based process according to claim 1, comprising:
   selecting an alcohol as said carbon precursor containing compound.

5. A water-based process according to claim 3, comprising:
   selecting an alcohol as said carbon precursor containing compound.

6. A water-based process according to claim 5, wherein said alcohol is selected from the group consisting of methanol, ethanol and isopropanol.

7. A water-based process according to claim 2, comprising:
   selecting a hydrocarbon as said carbon precursor containing compound.

8. A water-based process according to claim 1, comprising:
   supplementing the water vapor in said gas phase mixture with hydrogen peroxide to enhance OH radical production.

9. A water-based process according to claim 1, comprising:
   supplementing the water vapor in said gas phase mixture with hydrazine to enhance atomic H production.

10. A water-based process according to claim 1, comprising:

maintaining said substrate between 55° to 1000° C. and at a pressure between 0.005 to 760 Torr.

11. A water-based process according to claim 10, wherein said substrate is maintained at a temperature between 135° to 650° C. and at a pressure between 0.1 to 10 Torr.

12. A water-based process according to claim 1, wherein said disassociating step comprises:

energizing the gas phase mixture in a confined rf plasma discharge.

* * * * *